(12) United States Patent
Lai et al.

(10) Patent No.: US 9,780,255 B2
(45) Date of Patent: *Oct. 3, 2017

(54) NITRIDE SEMICONDUCTOR STRUCTURE AND SEMICONDUCTOR LIGHT EMITTING DEVICE INCLUDING THE SAME

(71) Applicant: Genesis Photonics Inc., Tainan (TW)

(72) Inventors: Yen-Lin Lai, Tainan (TW); Jyun-De Wu, Tainan (TW); Yu-Chu Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/850,970

(22) Filed: Sep. 11, 2015

(65) Prior Publication Data

US 2016/0035934 A1    Feb. 4, 2016

Related U.S. Application Data

(63) Continuation of application No. 13/963,127, filed on Aug. 9, 2013, now Pat. No. 9,147,800.

(30) Foreign Application Priority Data

Nov. 19, 2012 (TW) .............................. 101143153 A

(51) Int. Cl.
*H01L 33/00* (2010.01)
*H01L 33/06* (2010.01)
(Continued)

(52) U.S. Cl.
CPC .......... *H01L 33/06* (2013.01); *H01L 33/0025* (2013.01); *H01L 33/14* (2013.01); *H01L 33/325* (2013.01); *H01L 33/32* (2013.01)

(58) Field of Classification Search
CPC ..... H01L 33/06; H01L 33/0025; H01L 33/14; H01L 33/325; H01L 33/32
See application file for complete search history.

(56) References Cited

U.S. PATENT DOCUMENTS 6,252,894 B1   6/2001   Sasanuma et al.
6,278,054 B1   8/2001   Ho et al.
(Continued)

FOREIGN PATENT DOCUMENTS

CN   1413358   4/2003
CN   1426119   6/2003
(Continued)

OTHER PUBLICATIONS

"Office Action of China Related Application, application No. 201310029679.2", issued on Mar. 3, 2016, p. 1-p. 7.
(Continued)

*Primary Examiner* — Cheung Lee
*Assistant Examiner* — Stephen C Smith
(74) *Attorney, Agent, or Firm* — Jianq Chyun IP Office

(57) ABSTRACT

A nitride semiconductor structure and a semiconductor light emitting device are revealed. The semiconductor light emitting device includes a substrate disposed with a first type doped semiconductor layer and a second type doped semiconductor layer. A light emitting layer is disposed between the first type doped semiconductor layer and the second type doped semiconductor layer. The second type doped semiconductor layer is doped with a second type dopant at a concentration larger than $5\times10^{19}$ cm$^{-3}$ while a thickness of the second type doped semiconductor layer is smaller than 30 nm. Thereby the semiconductor light emitting device provides a better light emitting efficiency.

20 Claims, 2 Drawing Sheets

(51) Int. Cl.
*H01L 33/14* (2010.01)
*H01L 33/32* (2010.01)

(56) References Cited

U.S. PATENT DOCUMENTS

| | | | |
|---|---|---|---|
| 6,319,742 | B1 | 11/2001 | Hayashi et al. |
| 7,208,752 | B2 | 4/2007 | Lai et al. |
| 7,759,694 | B2 | 7/2010 | Komada |
| 8,575,592 | B2 | 11/2013 | Bergmann et al. |
| 8,604,461 | B2 | 12/2013 | Driscoll et al. |
| 8,942,269 | B2 | 1/2015 | Kasugai et al. |
| 9,147,800 | B2* | 9/2015 | Lai .................. H01L 33/14 |
| 2002/0014632 | A1 | 2/2002 | Kaneyama et al. |
| 2002/0158259 | A1* | 10/2002 | Ono ................ H01S 5/32341 257/79 |
| 2003/0085409 | A1 | 5/2003 | Shen et al. |
| 2004/0058465 | A1 | 3/2004 | Taki |
| 2004/0264533 | A1 | 12/2004 | Matsumura et al. |
| 2005/0127391 | A1 | 6/2005 | Yanamoto |
| 2005/0224835 | A1 | 10/2005 | Nomura et al. |
| 2006/0097270 | A1 | 5/2006 | Yuri |
| 2006/0175600 | A1 | 8/2006 | Sato et al. |
| 2007/0040240 | A1 | 2/2007 | Dwilinski et al. |
| 2007/0096077 | A1* | 5/2007 | Sanga ................. H01L 29/205 257/13 |
| 2008/0081390 | A1 | 4/2008 | Gaska et al. |
| 2008/0135829 | A1* | 6/2008 | Lee .................. H01L 33/325 257/13 |
| 2008/0135868 | A1 | 6/2008 | Okagawa et al. |
| 2008/0315179 | A1 | 12/2008 | Kim et al. |
| 2008/0315243 | A1 | 12/2008 | Ueno et al. |
| 2009/0016397 | A1 | 1/2009 | Terano et al. |
| 2009/0026489 | A1 | 1/2009 | Kuramoto |
| 2010/0019222 | A1 | 1/2010 | Yan et al. |
| 2010/0034231 | A1 | 2/2010 | Fukuda et al. |
| 2010/0044674 | A1 | 2/2010 | Kim |
| 2010/0133506 | A1 | 6/2010 | Nakanishi et al. |
| 2010/0142576 | A1 | 6/2010 | Cohen et al. |
| 2010/0213436 | A1 | 8/2010 | Khan |
| 2010/0219445 | A1 | 9/2010 | Yokoyama et al. |
| 2010/0243985 | A1 | 9/2010 | Yan et al. |
| 2010/0289067 | A1 | 11/2010 | Mishra et al. |
| 2011/0001126 | A1 | 1/2011 | Kamikawa et al. |
| 2011/0114916 | A1* | 5/2011 | Yoshizumi ............ B82Y 20/00 257/13 |
| 2011/0147763 | A1 | 6/2011 | Hanawa et al. |
| 2012/0037881 | A1 | 2/2012 | Kim et al. |
| 2012/0217473 | A1 | 8/2012 | Shur et al. |
| 2013/0228741 | A1 | 9/2013 | Fu |
| 2013/0228743 | A1 | 9/2013 | Fu et al. |
| 2014/0138616 | A1 | 5/2014 | Huang et al. |
| 2014/0138617 | A1 | 5/2014 | Lai et al. |
| 2014/0138618 | A1 | 5/2014 | Wu et al. |
| 2014/0138619 | A1 | 5/2014 | Lai et al. |
| 2015/0179874 | A1 | 6/2015 | Li |
| 2015/0263226 | A1 | 9/2015 | Huang et al. |

FOREIGN PATENT DOCUMENTS

| | | |
|---|---|---|
| CN | 101073160 | 11/2007 |
| CN | 101188264 | 5/2008 |
| CN | 101267008 | 9/2008 |
| CN | 101276875 | 10/2008 |
| CN | 101461069 | 6/2009 |
| CN | 101488548 | 7/2009 |
| CN | 101527341 | 9/2009 |
| CN | 101542760 | 9/2009 |
| CN | 101661878 | 3/2010 |
| CN | 101685844 | 3/2010 |
| CN | 101494265 | 3/2011 |
| CN | 102150288 | 8/2011 |
| CN | 102157646 | 8/2011 |
| CN | 102201514 | 9/2011 |
| CN | 102208505 | 10/2011 |
| CN | 102208511 | 10/2011 |
| CN | 102214739 | 10/2011 |
| CN | 101645480 | 5/2012 |
| CN | 102474076 | 5/2012 |
| CN | 102569571 | 7/2012 |
| CN | 102637787 | 8/2012 |
| CN | 102185056 | 10/2012 |
| CN | 102738328 | 10/2012 |
| CN | 102751393 | 10/2012 |
| CN | 103972339 | 8/2014 |
| CN | 103972340 | 8/2014 |
| CN | 103972342 | 8/2014 |
| JP | H08330630 | 12/1996 |
| JP | H10144960 | 5/1998 |
| JP | 2000196143 | 7/2000 |
| JP | 2004134750 | 4/2004 |
| JP | 2007227671 | 9/2007 |
| JP | 2009021361 | 1/2009 |
| JP | 2009-152448 | * 7/2009 |
| JP | 2009152448 | 7/2009 |
| JP | 2011-023541 | 2/2011 |
| JP | 2011249776 | 12/2011 |
| TW | 200529464 | 9/2005 |
| TW | 200908393 | 2/2009 |
| TW | 201011952 | 3/2010 |
| TW | 201135967 | 10/2011 |
| TW | 201208112 | 2/2012 |
| TW | 201222869 | 6/2012 |
| TW | 201242085 | 10/2012 |
| TW | 201338196 | 9/2013 |
| WO | 0248434 | 6/2002 |
| WO | 2007105882 | 9/2007 |
| WO | 2012127778 | 9/2012 |

OTHER PUBLICATIONS

"Office Action of China Related Application, application No. 201310030319.4", issued on Mar. 3, 2016, p. 1-p. 7.
"Office Action of China Related Application, application No. 201310029644.9", issued on Mar. 2, 2016, p. 1-p. 5.
"Office Action of U.S. Related Application" U.S. Appl. No. 14/257,012, issued on Dec. 29, 2014, p. 1-p. 11.
"Office Action of Taiwan Counterpart Application" application No. 102148234, issued on Aug. 18, 2015, p. 1-p. 6.
"Office Action of U.S. Co-pending Application" U.S. Appl. No. 13/963,127, issued on Jan. 2, 2015, p. 1-p. 8.
"Office Action of Taiwan Counterpart Application" application No. 101143153, issued on Sep. 29, 2014, p. 1-p. 5.
"Office Action of TW Related Application" application No. 101143155, issued on Mar. 9, 2015, p. 1-p. 4.
"Office Action of Japan Related Application" application No. 2013183282, issued on Sep. 22, 2014, p. 1-p. 4.
"Response to Office Action of Japan Related Application" application No. 2013183282, submission on Dec. 16, 2014, p. 1-p. 8.
"Office Action of Japan Related Application" application No. 2013183282, issued on Apr. 7, 2015, p. 1-p. 5.
"Written Appeal of Japan Related Application" application No. 2013183282, submission on Aug. 7, 2015, p. 1-p. 21.
"Office Action of Taiwan Related Application" application No. 101150593, issued on Nov. 21, 2014, p. 1-p. 6.
"Office Action of Taiwan Related Application" application No. 101150695, issued on Feb. 24, 2015, p. 1-p. 6.
"Notice of Allowance of Japan Related Application" application No. 2013183282, issued on Oct. 20, 2015, p. 1-p. 3.
"Office Action of Taiwan Related Application, application No. 104119968", issued on Jan. 21, 2016, p. 1-p. 5.
"Office Action of Taiwan Related Application, application No. 104128296", issued on Feb. 17, 2016, p. 1-p. 5.
"Office Action of China Related Application, application No. 201310029901.9", issued on Feb. 23, 2016, p. 1-p. 7.
"Office Action of China Related Application, application No. 201310029711.7", issued on Mar. 3, 2016, p. 1-p. 7.
"Office Action of Related U.S. Appl. No. 14/727,786", issued on Mar. 3, 2016, p. 1-p. 25.
"Office Action of Taiwan Related Application No. 104124479", issued on May 19, 2016, p. 1-p. 7.

(56) References Cited

OTHER PUBLICATIONS

"Office Action of Related U.S. Appl. No. 14/732,798", issued on Mar. 2, 2016, p. 1-p. 33.
"Office Action of Japan Related Application No. 2015-156949", issued on May 31, 2016, p. 1-p. 2.
"Office Action of CN Related Application, application No. 201310029644.9", issued on Nov. 1, 2016, p. 1-p. 8.
"Office Action of China Related Application No. 201310028759.6," issued on Nov. 7, 2016, p. 1-p. 5.
"Office Action of China Related Application No. 201310030319.4", issued on Jul. 29, 2016, p. 1-p. 7.
Office Action of China Related Application, application No. 201410014540.5, issued on Dec. 20, 2016, p. 1-p. 6.
"Office Action of China Related Application No. 201310029644.9," dated Apr. 24, 2017, p. 1-p. 8.
Office Action of China Related Application, application No. 201310029711.7 dated May 27, 2017, p. 1-p. 5.
Office Action of US Related Application, U.S. Appl. No. 15/499,913 dated Jun. 30, 2017, p. 1-p. 24.

\* cited by examiner

NITRIDE SEMICONDUCTOR STRUCTURE AND SEMICONDUCTOR LIGHT EMITTING DEVICE INCLUDING THE SAME

CROSS-REFERENCE TO RELATED APPLICATION

This application is a continuation application of and claims the priority benefit of U.S. application Ser. No. 13/963,127, filed on Aug. 9, 2013, now allowed. The prior U.S. application Ser. No. 13/963,127 claims the priority benefit of Taiwan application serial no. 101143153, filed on Nov. 19, 2012. The entirety of each of the above-mentioned patent applications is hereby incorporated by reference herein and made a part of this specification.

BACKGROUND OF THE INVENTION

1. Field of the Invention

The present invention relates to a nitride semiconductor structure and a semiconductor light emitting device, especially to a nitride semiconductor structure and a semiconductor light emitting device including a second type doped semiconductor layer with a high dopant concentration (larger than $5 \times 10^{19}$ cm$^{-3}$) and a small thickness (smaller than 30 nm) to improve a light-extraction efficiency and make the semiconductor light emitting device have a better light emitting efficiency.

2. Description of Related Art

Generally, a nitride light emitting diode is produced by forming a buffer layer on a substrate first. Then a n-type semiconductor layer, a light emitting layer and a p-type semiconductor layer are formed on the buffer layer in turn by epitaxial growth. Next use photolithography and etching processes to remove a part of the p-type semiconductor layer and a part of the light emitting layer until a part of the n-type semiconductor layer is exposed. Later a n-type electrode and a p-type electrode are respectively formed on the exposed n-type semiconductor layer and the p-type semiconductor layer. Thus a light emitting diode device is produced. The light emitting layer has a multiple quantum well (MQW) structure formed by a plurality of well layers and barrier layers disposed alternately. The band gap of the well layer is lower than that of the barrier layer so that electrons and holes are confined by each well layer of the MQW structure. Thus electrons and holes are respectively injected from the n-type semiconductor layer and the p-type semiconductor layer to be combined with each other in the well layers and photons are emitted.

The brightness of LED is determined by the internal quantum efficiency and a light-extraction efficiency. The internal quantum efficiency (IQE) is the ratio of electron hole pairs involved in radiation recombination to the injected electron hole pairs. The refractive index of air and GaN respectively is 1 and 2.4. According to total internal reflection equation, the critical angle of GaN LED that allows light to be emitted into air is about 24 degrees. Thus the light-extraction rate is about 4.34%. Due to total internal reflection of GaN and air, light emitting from LED is restricted inside the LED and the light-extraction rate is quite low. Thus many researches focus on improvement of the light-extraction efficiency. For example, one of the methods is to perform surface treatments on a p-type GaN layer for reducing the total internal reflection and further improving the light-extraction efficiency. The surface treatment includes surface roughening and changes of LED morphology. Another method is to separate the n-type GaN layer from the substrate and a rough structure is formed over the n-type GaN layer. Then the GaN semiconductor layer is attached to the substrate by glue for improving the light-extraction efficiency. However, the first method can only be used to treat an exposed p-type GaN semiconductor layer on top of the LED chip. Thus the improvement of the light-extraction efficiency has a certain limit. The process of the second method is quite complicated and the glue has a problem of poor heat dissipation. Therefore the light emitting efficiency of LED produced by the above two methods is unable to be increased effectively.

Moreover, the concentration of the dopant in the p-type GaN layer is unable to be increased effectively so that the resistance of the p-type GaN layer is quite large. Thus current is unable to be spread evenly in the p-type GaN layer when the current flows from metal electrodes to the GaN semiconductor layer. The uneven current spreading results in that the lighting area is confined under the metal electrodes (n-type electrode ad p-type electrode). The light emitting efficiency of LED is also decreased significantly.

In order to overcome the above shortcomings of the nitride semiconductor structure and the semiconductor light emitting device available now, there is a need to provide a novel nitride semiconductor structure and a new semiconductor light emitting device.

SUMMARY OF THE INVENTION

Therefore it is a primary object of the present invention to provide a nitride semiconductor structure in which a second type doped semiconductor layer has a high concentration of a second type dopant (larger than $5 \times 10^{19}$ cm$^{-3}$) and a thickness that is smaller than 30 nm so as to improve the light-extraction efficiency.

It is another object of the present invention to provide a semiconductor light emitting device including the above nitride semiconductor structure for providing a good light emitting efficiency.

In order to achieve the above objects, a nitride semiconductor structure comprises a first type doped semiconductor layer; a light emitting layer; a gallium nitride based hole supply layer, containing aluminum and indium; and a second type doped semiconductor layer. The light emitting layer is disposed between the first type doped semiconductor layer and the hole supply layer, and the hole supply layer is disposed between the light emitting layer and the second type doped semiconductor layer, and the hope supply layer is doped with a quadrivalent element.

In order to achieve the above objects, a nitride semiconductor structure comprises a first type doped semiconductor layer; a light emitting layer, comprising a multiple quantum well structure (MQW); a gallium nitride based hole supply layer, containing aluminum and indium; a second type doped semiconductor layer. The light emitting layer is disposed between the first type doped semiconductor layer and the hole supply layer, and the hole supply layer is disposed between the light emitting layer and the second type doped semiconductor layer, and a band gap of the hole supply layer is larger than that of a gallium nitride based well layer of the MQW structure.

In order to achieve the above objects, a nitride semiconductor structure comprises a first type doped semiconductor layer; a gallium nitride based first type carrier blocking layer, containing aluminum; a light emitting layer, comprising a multiple quantum well structure (MQW); a gallium nitride based hole supply layer, containing aluminum and indium; a gallium nitride based second type carrier blocking layer, containing aluminum; a second type doped semiconductor layer. The first type carrier blocking layer is disposed between the light emitting layer and the first type doped semiconductor layer, and the hole supple layer is disposed between the light emitting layer and the second type carrier blocking layer, and the second type carrier blocking layer is disposed between the second type doped semiconductor layer and the hole supply layer.

A semiconductor light emitting device of the present invention includes the above nitride semiconductor structure disposed on a substrate, a first type electrode and the second type electrode used together for providing electric power. Due to smaller thickness of the second type doped semiconductor layer, the second type electrode is getting closer to the surface of the light emitting layer. Thus a stronger coupling is generated due to resonance between photons from the light emitting layer and surface plasmon. Therefore the light emitting efficiency is improved. Moreover, the second type doped semiconductor layer has a higher concentration of the second type dopant than that of the conventional p-type GaN layer so that the resistance of the second type doped semiconductor layer is lower. Thus even current spreading in the second type doped semiconductor layer is achieved when the current flows from the second type electrode to the first type electrode. Therefore the LED gets a better light emitting efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In the following embodiments, when it is mentioned that a layer of something or a structure is disposed over or under a substrate, another layer of something, or another structure, that means the two structures, the layers of something, the layer of something and the substrate, or the structure and the substrate can be directly or indirectly connected. The indirect connection means there is at least one intermediate layer disposed therebetween.

Figure 1:
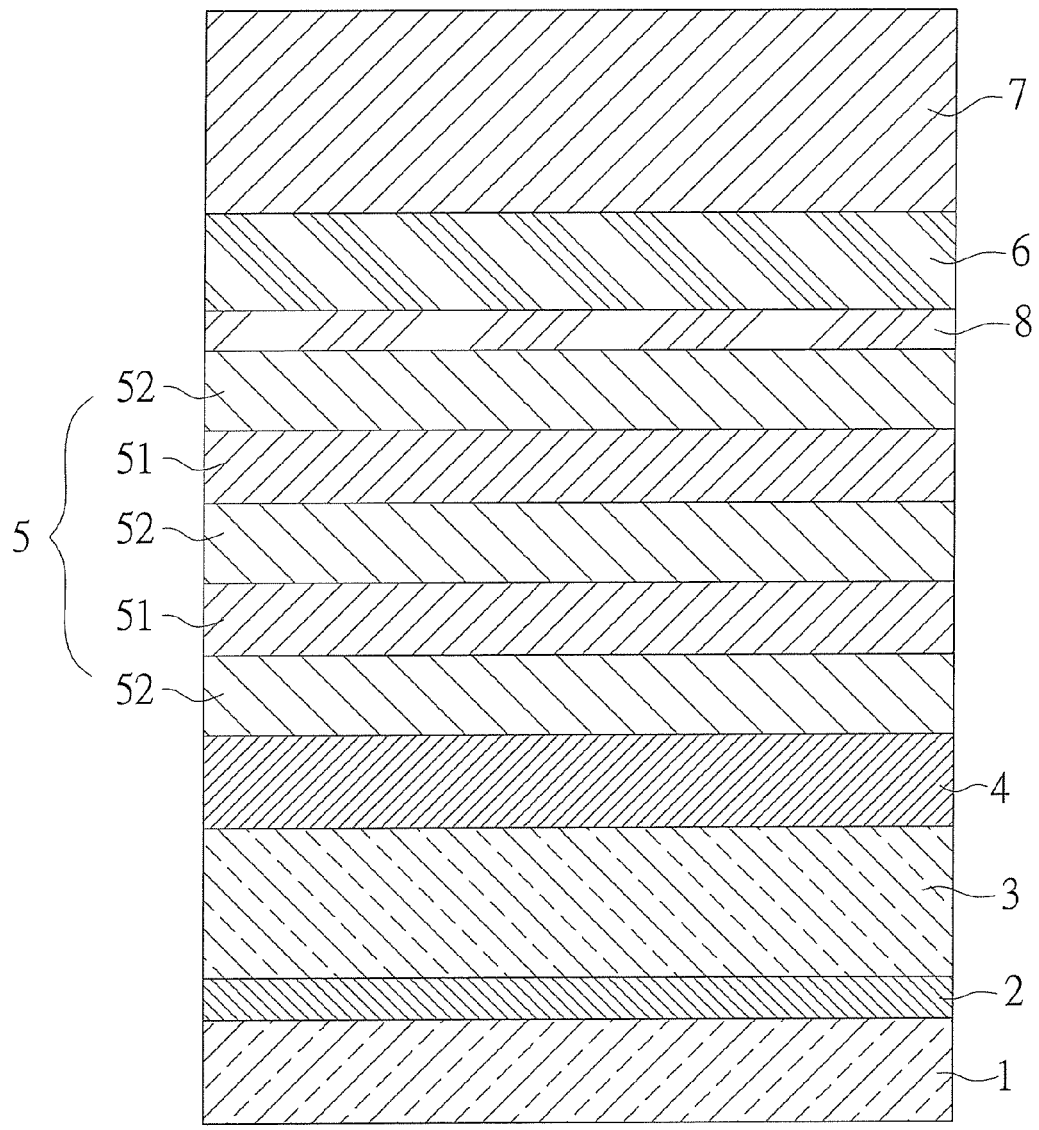
FIG. 1 is a schematic drawing showing a cross section of an embodiment of a nitride semiconductor structure according to the present invention.

Referring to FIG. 1, a cross section of an embodiment of nitride semiconductor structure according to the present invention is revealed. The nitride semiconductor structure includes a first type doped semiconductor layer 3 and a second type doped semiconductor layer 7. A light emitting layer 5 is disposed between the first type doped semiconductor layer 3 and the second type doped semiconductor layer 7. The second type doped semiconductor layer 7 is doped with a second type dopant at a concentration larger than $5 \times 10^{19}$ cm$^{-3}$ while a thickness of the second type doped semiconductor layer is smaller than 30 nm. The second dopant can be magnesium or zinc while magnesium is preferred.

Moreover, the first type doped semiconductor layer 3 is made of Si-doped or Ge-doped GaN based materials (n-type doped GaN based semiconductor layer) and the second type doped semiconductor layer 7 is made of Mg-doped GaN based materials (p-type doped GaN based semiconductor layer). The concentration of the Mg doped is larger than $5 \times 10^{19}$ cm$^{-3}$. The materials are not limited to the above ones. The first type doped semiconductor layer 3 and the second type doped semiconductor layer 7 are produced by metalorganic chemical vapor deposition (MOCVD) while the second type doped semiconductor layer 7 is formed under relatively higher pressure (larger than 300 torr).

Furthermore, a hole supply layer 8 is disposed between the light emitting layer 5 and the second type doped semiconductor layer 7. The hole supply layer 8 is made of $Al_xIn_yGa_{1-x-y}N$ (0<x<1, 0<y<1, 0<x+y<1) and is doped with a second dopant (such as Mg or Zn) at a concentration larger than $10^{18}$ cm$^{-3}$. Besides the second dopant, the hole supply layer 8 is also doped with a Group IV-A element (carbon is preferred) at a concentration ranging from $10^{17}$ to $10^{20}$ cm$^{-3}$. The pentavalent nitrogen atom is replaced by carbon (Group IV-A) so that there is one more positively charged hole. Thus the hole supply layer 8 has a higher concentration of holes and more holes are provided to enter the light emitting layer 5. Therefore the electron-hole recombination is further increased. As to the light emitting layer 5, it has a multiple quantum well (MQW) structure. The band gap of the hole supply layer 8 is larger than that of a well layer 51 of the MQW structure so that holes in the hole supply layer 8 can enter the well layer 51 of the MQW structure to increase the electron-hole recombination rate and further improve the light emitting efficiency.

In addition, for reducing stress caused by lattice mismatch between the well layer and the barrier layer of the MQW structure, the barrier layer 52 of the MQW structure is made of quaternary $Al_xIn_yGa_{1-x-y}N$ while x and y satisfy the conditions: 0<x<1, 0<y<1, and 0<x+y<1. The well layer 51 is made of ternary $In_zGa_{1-z}N$ and 0<z<1. Due to the property that both quaternary AlGaInN barrier layers and ternary InGaN well layers have the same element-indium, the quaternary composition can be adjusted and improved for providing a lattice matching composition. Thus the barrier layers and the well layers have closer lattice constant. The thickness of the well layer 51 is ranging from 3.5 nm to 7 nm. The barrier layer 52 is doped with a first type dopant (such as Si or Ge) at a concentration ranging from $10^{16}$ cm$^{-3}$ to $10^{18}$ cm$^{-3}$ so as to reduce carrier screening effect and increase carrier-confinement.

The above nitride semiconductor structure further includes a second type carrier blocking layer 6 disposed between the hole supply layer 8 and the second type doped semiconductor layer 7, and a first type carrier blocking layer 4 disposed between the light emitting layer 5 and the first type doped semiconductor layer 3. The second type carrier blocking layer 6 is made of $Al_xGa_{1-x}N$ (0<x<1) while the first type carrier blocking layer 4 is made of $Al_xGa_{1-x}N$ (0<x<1). Thereby carriers are confined in the MQW structure and the electron-hole recombination rate is increased due to the property that the band gap of AlGaN containing aluminum is larger than the band gap of GaN. Therefore the light emitting efficiency is increased.

Figure 2:
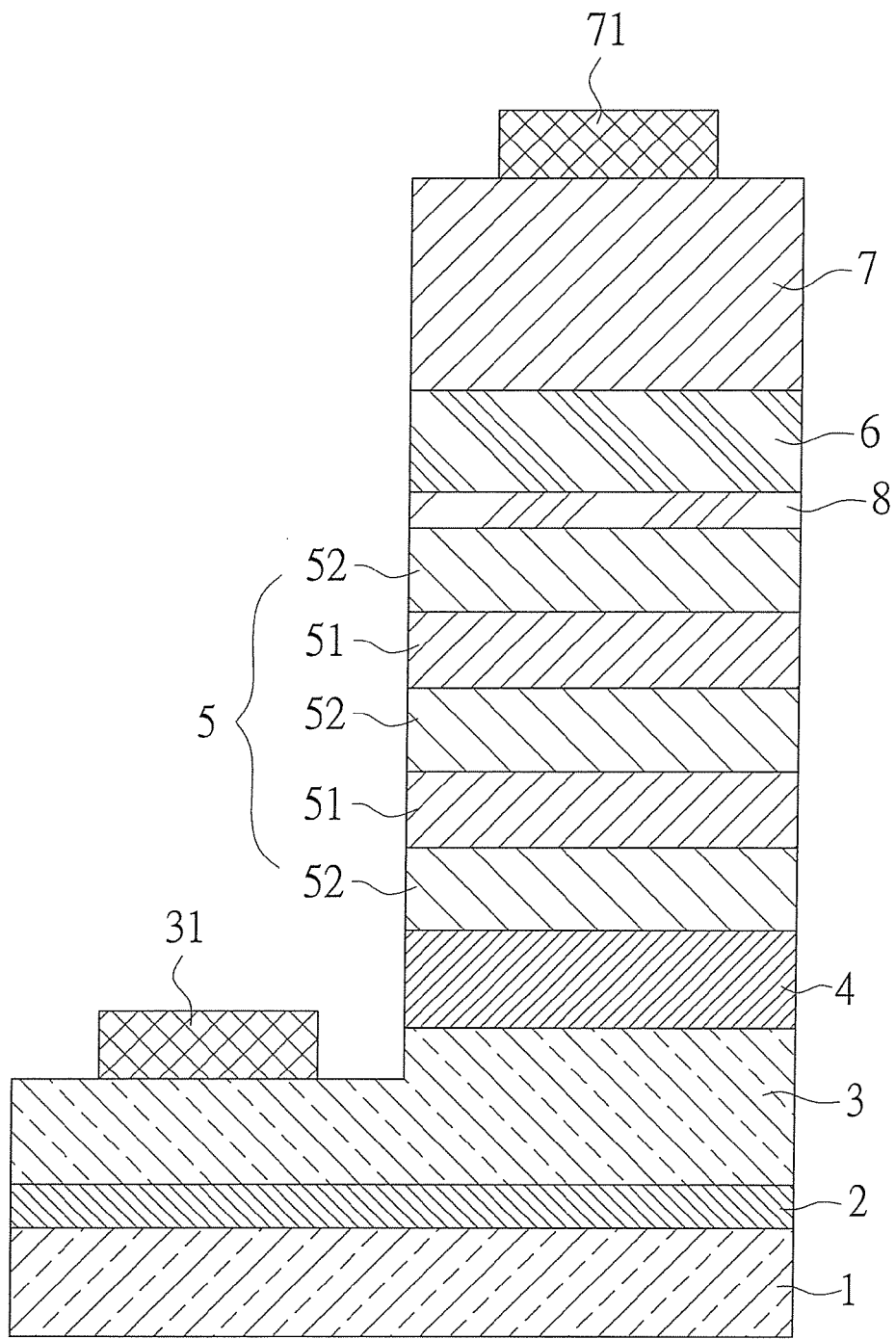
FIG. 2 is a schematic drawing showing a cross section of an embodiment of a semiconductor light emitting device including a nitride semiconductor structure according to the present invention.

The above nitride semiconductor structure is applied to semiconductor light emitting devices. Referring to FIG. 2, a cross sectional view of an embodiment of a semiconductor light emitting device is revealed. The semiconductor light emitting device at least includes: a substrate 1, a first type doped semiconductor layer 3 disposed over the substrate 1 and made of Si-doped or Ge-doped GaN based materials, a light emitting layer 5 disposed over the first type doped semiconductor layer 3, a second type doped semiconductor layer 7 disposed over the light emitting layer 5, a first type electrode 31 disposed on and in ohmic contact with the first type doped semiconductor layer 3, and a second type electrode 71 disposed on and in ohmic contact with the second type doped semiconductor layer 7.

The materials for the substrate 1 include sapphire, silicon, SiC, ZnO, GaN, etc. The second type doped semiconductor layer 7 is doped with a second type dopant at a concentration larger than $5 \times 10^{19}$ cm$^{-3}$ and having a thickness smaller than 30 nm. The first type electrode 31 and the second type electrode 71 are used together to provide electric power and are made of (but not limited to) the following materials titanium, aluminum, gold, chromium, nickel, platinum, and their alloys. The manufacturing processes are well-known to people skilled in the art.

Moreover, a buffer layer 2 made of $Al_xGa_{1-x}N$ (0<x<1) is disposed between the substrate 1 and the first type doped semiconductor layer 3 and is used for improving lattice constant mismatch between the heterogeneous substrate 1 and the first type doped semiconductor layer 3 grown on the heterogeneous substrate 1. The buffer layer 2 is made of GaN, InGaN, SiC, ZnO, etc.

When using the above semiconductor light emitting device, the light-extraction efficiency is significantly improved and a better light emitting efficiency is achieved because that the second type doped semiconductor layer 7 is doped with high-concentration Magnesium (higher than $5 \times 10^{19}$ cm$^{-3}$) and is formed under relatively high pressure (larger than 300 torr) with a thickness smaller than 30 nm that is thinner than conventional p-type GaN layer. The reasonable inference is that a stronger coupling is generated due to photons from the light emitting layer in resonance with surface plasmon when the second type electrode is getting closer to the surface of the light emitting layer. Thus the light emitting efficiency is increased. The surface plasmon resonance means free electrons fluctuations occurring on the surface of the second type electrode 71. Moreover, compared with the conventional p-type GaN layer, the second type doped semiconductor layer 7 has a higher concentration of the Mg dopant so that its resistance is relatively lower. Thus even current spreading is achieved when the current is flowing from the second type electrode 71 to the second type doped semiconductor layer 7. Therefore the light emitting diode gets a better light emitting efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nitride semiconductor structure comprising:
a first type doped semiconductor layer;
a light emitting layer;
a gallium nitride based hole supply layer, containing aluminum and indium;
a carrier blocking layer; and
a second type doped semiconductor layer, wherein the light emitting layer is disposed between the first type doped semiconductor layer and the hole supply layer, the hole supply layer is disposed between the light emitting layer and the carrier blocking layer, the carrier blocking layer is disposed between the second type doped semiconductor layer and the hole supply layer, and the hole supply layer is doped with a quadrivalent element.

2. The nitride semiconductor structure as claimed in claim 1, wherein the light emitting layer has a multiple quantum well (MQW) structure, and a band gap of the hole supply layer is larger than a band gap of a well layer of the MQW structure.

3. The nitride semiconductor structure as claimed in claim 2, wherein the MQW structure comprises a plurality of gallium nitride based barrier layers, which contain aluminum and indium, and a plurality of gallium nitride based well layers, which contain indium.

4. The nitride semiconductor structure as claimed in claim 1, wherein the second type doped semiconductor layer is doped with the concentration larger than $5 \times 10^{19}$ cm$^{-3}$ and a thickness of the second type doped semiconductor layer is smaller than 30 nm.

5. The nitride semiconductor structure as claimed in claim 1, wherein the quadrivalent element is carbon.

6. The nitride semiconductor structure as claimed in claim 1, wherein the hole supply layer is doped with the quadrivalent element at a concentration ranging from $10^{17}$ cm$^{-3}$ to $10^{20}$ cm$^{-3}$.

7. The nitride semiconductor structure as claimed in claim 1, wherein the hole supply layer is doped with a second typed dopant at a concentration larger than $10^{18}$ cm$^{-3}$.

8. A nitride semiconductor structure comprising:
a first type doped semiconductor layer;
a light emitting layer, comprising a multiple quantum well structure (MQW);
a gallium nitride based hole supply layer, containing aluminum and indium;
a carrier blocking layer; and
a second type doped semiconductor layer, wherein the light emitting layer is disposed between the first type doped semiconductor layer and the hole supply layer, the hole supply layer is disposed between the light emitting layer and the carrier blocking layer, the carrier blocking layer is disposed between the second type doped semiconductor layer and the hole supply layer, and a band gap of the hole supply layer is larger than that of a gallium nitride based well layer of the MQW structure.

9. The nitride semiconductor structure as claimed in claim 8, wherein the MQW structure comprises a plurality of gallium nitride based barrier layers, which contain aluminum and indium, and the gallium nitride based well layers contain indium.

10. The nitride semiconductor structure as claimed in claim 8, wherein the second type doped semiconductor layer is doped with the concentration larger than $5 \times 10^{19}$ cm$^{-3}$ and a thickness of the second type doped semiconductor layer is smaller than 30 nm.

11. The nitride semiconductor structure as claimed in claim 8, wherein the hole supply layer is doped with a Group IV-A element.

12. The nitride semiconductor structure as claimed in claim 11, wherein the hole supply layer is doped with carbon at a concentration ranging from $10^{17}$ cm$^{-3}$ to $10^{20}$ cm$^{-3}$.

13. The nitride semiconductor structure as claimed in claim 8, wherein the hole supply layer is doped with a second typed dopant at a concentration larger than $10^{18}$ cm$^{-3}$.

14. A nitride semiconductor structure comprising:
a first type doped semiconductor layer;

a gallium nitride based first type carrier blocking layer, containing aluminum;
a light emitting layer, comprising a multiple quantum well structure (MQW);
a gallium nitride based hole supply layer, containing aluminum and indium;
a gallium nitride based second type carrier blocking layer, containing aluminum;
a second type doped semiconductor layer, wherein the first type carrier blocking layer is disposed between the light emitting layer and the first type doped semiconductor layer, and the hole supple layer is disposed between the light emitting layer and the second type carrier blocking layer, and the second type carrier blocking layer is disposed between the second type doped semiconductor layer and the hole supply layer.

15. The nitride semiconductor structure as claimed in claim 14, wherein the light emitting layer has a multiple quantum well (MQW) structure, and a band gap of the hole supply layer is larger than a band gap of a gallium nitride based well layer of the MQW structure.

16. The nitride semiconductor structure as claimed in claim 14, wherein the MQW structure comprises a plurality of gallium nitride based barrier layers, which contain aluminum and indium, and a plurality of gallium nitride based well layers, which contain indium.

17. The nitride semiconductor structure as claimed in claim 14, wherein the second type doped semiconductor layer is doped with the concentration larger than $5 \times 10^{19}$ cm$^{-3}$ and a thickness of the second type doped semiconductor layer is smaller than 30 nm.

18. The nitride semiconductor structure as claimed in claim 14, wherein the hole supply layer is doped with a Group IV-A element.

19. The nitride semiconductor structure as claimed in claim 18, wherein the hole supply layer is doped with carbon at a concentration ranging from $10^{17}$ cm$^{-3}$ to $10^{20}$ cm$^{-3}$.

20. The nitride semiconductor structure as claimed in claim 14, wherein the hole supply layer is doped with a second typed dopant at a concentration larger than $10^{18}$ cm$^{-3}$.

* * * * *